United States Patent
Bedrosian

(10) Patent No.: US 7,183,863 B1
(45) Date of Patent: Feb. 27, 2007

(54) SELF-INITIALIZING FREQUENCY DETECTOR

(75) Inventor: Paul Stephen Bedrosian, Andover, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/175,521

(22) Filed: Oct. 20, 1998

(51) Int. Cl.
*H03L 7/00* (2006.01)

(52) U.S. Cl. .................. 331/25; 331/14; 331/16; 331/17; 331/DIG. 2; 327/156; 375/376

(58) Field of Classification Search .......... 331/DIG. 2, 331/1 R, 11, 12, 1 A, 16, 25, 17; 333/14; 329/346, 122, 124, 50; 327/156; 375/376
See application file for complete search history.

(56) References Cited

U.S. PATENT DOCUMENTS

| | | | | |
|---|---|---|---|---|
| 4,757,279 A | * | 7/1988 | Balzano | ........................ 331/4 |
| 4,853,642 A | * | 8/1989 | Otani et al. | ................. 329/306 |
| 5,015,971 A | * | 5/1991 | Taylor et al. | ................. 331/16 |
| 5,053,724 A | * | 10/1991 | Ogino et al. | ................. 331/14 |
| 5,703,538 A | * | 12/1997 | Lo et al. | ........................ 331/4 |
| 5,719,508 A | * | 2/1998 | Daly | ........................... 327/12 |
| 5,903,748 A | * | 5/1999 | McCollogh et al. | ........ 395/558 |

* cited by examiner

*Primary Examiner*—Robert Pascal
*Assistant Examiner*—Kimberly E. Glenn

(57) ABSTRACT

A phase-locked loop (PLL) locks onto an input signal to provide an output signal that is proportional in frequency to the input signal. The PLL also detects whether an input signal's frequency falls outside a predetermined range and, whenever the input signal's frequency falls outside of range, the PLL provides a stable output signal at a predetermined frequency. While the PLL is providing a stable output signal in this manner it also monitors the input signal to determine whether the input signal's frequency has returned to within a re-qualification frequency range. If the input signal's frequency does fall within the re-qualification range, the PLL proceeds to lock onto the input signal.

30 Claims, 7 Drawing Sheets

FIG. 7

| PPM OFF | TRANSITION PERIOD (SEC) | |
|---|---|---|
| 1 | 125.0 | |
| 2 | 62.5 | |
| 3 | 41.7 | |
| 4 | 31.3 | |
| 5 | 25.0 | STRATUM III LIMIT |
| 6 | 20.8 | |
| 7 | 17.9 | |
| 8 | 15.6 | |
| 9 | 13.9 | |
| 10 | 12.5 | |
| 11 | 11.4 | |
| 12 | 10.4 | |
| 13 | 9.6 | |
| 14 | 8.9 | |
| 15 | 8.3 | |
| 16 | 7.8 | |
| 17 | 7.4 | |
| 18 | 6.9 | |
| 19 | 6.6 | |
| 20 | 6.3 | |
| 21 | 6.0 | |
| 22 | 5.7 | |
| 23 | 5.4 | |
| 24 | 5.2 | |
| 25 | 5.0 | |
| 26 | 4.8 | |
| 27 | 4.6 | |
| 28 | 4.5 | |
| 29 | 4.3 | |
| 30 | 4.2 | |
| 31 | 4.0 | |
| 32 | 3.9 | STRATUM IV LIMIT |

TABLE 1

SELF-INITIALIZING FREQUENCY DETECTOR

FIELD OF THE INVENTION

The invention relates to phase locked loops and, more particularly, to self-initializing frequency detectors for phase-locked loops.

BACKGROUND

A phase locked loop (PLL) is a known circuit that, generally, acts as a feedback control loop which employs the phase difference between a time-varying input signal and a time-varying output signal to force the output signal to a frequency that is proportionate to that of the input signal. PLLs are employed in a variety of applications such as synchronous data communications, tone decoding, demodulation of signals, frequency multiplication and synthesis, and signal regeneration. In such applications the PLL output generally used by downstream circuitry to in some way track the PLL input. PLLs and some of their applications are discussed, for example, in, "The Art of Electronics", Second Edition, Paul Horowitz and Winfield Hill, Cambridge University Press, 1989, pp. 641, 655 which is hereby incorporated by reference.

PLLs may be characterized, in part, by their capture range and by their lock range. Typically, a PLL will be able to "capture", or lock onto, signals having a relatively narrow range of frequencies. Once the signal is captured though, the PLL will be able to track the input signal through a larger range of frequencies, commonly referred to as the PLL's lock range. Should the frequency of the PLL's input signal change, for any of a number of reasons, to a frequency that falls outside the PLL's lock range, the PLL will "lose lock" and no longer track the input signal. In response to the loss of lock, the PLL may produce an output signal of somewhat random frequency or, in the course of attempting to reacquire lock, the PLL may "thrash about" thereby producing an output signal of wildly varying frequency. Such wild variations in a PLL output signal's frequency could severely disrupt the operation of circuitry that relies upon the PLL for a stable frequency source.

A PLL that is capable of detecting an input signal's frequency excursion outside a predetermined frequency range, such as the PLL's lock range, would therefore be advantageous. Additionally, a PLL that is capable of steady operation during such frequency excursions and is capable of "re-qualifying" an input signal once the input signal has returned to an acceptable frequency range would be highly desirable.

PLLs are often employed within telecommunications systems to provide re-timed synchronization signals throughout a telecommunications system network. Such re-timed signals may be employed to distribute clock signals within a SONET network, for example. Such clocks are typically arranged in a hierarchy, with the clock's frequency accuracy determining the clock's hierarchical ranking. That is, a Stratum I clock, the most accurate, provides a frequency accuracy of $1 \times 10^{-11}$ parts per million (PPM), a Stratum II clock provides a frequency accuracy of $1.6 \times 10^{-8}$ PPM, and so on. Stratum clocks and SONET networks are known and are discussed, for example, in "SONET Transport Systems: Common Criteria Network Element Architectural Features", Bellcore document GR-253-CORE, Issue 2, December 1995, "Clocks For The Synchronized Network: Common Generic Criteria", Bellcore document GR-1244-CORE, Issue 1, June 1995, and "Generic Requirements For Timing Signal Generators", Bellcore document GR-378-CORE, Issue 1, June 1995, all of which are hereby incorporated by reference.

Upper level Stratum clocks provide synchronization to lower level Stratum clocks. That is, a Stratum I clock may provide synchronization information to a Stratum II, Stratum III or lower level clock, but a Stratum II clock will not provide synchronization to a Stratum I clock. Should an upstream Stratum I clock fail, sending it's output signal to a frequency outside it's specified accuracy, for example, downstream clocks which are synchronized to the failed upstream clock may attempt, in the manner described above in relation to PLLs, to synchronize to the failed upstream clock. A PLL that is capable of detecting an input signal's frequency deviation, of providing a steady output signal during such an excursion, and of re-qualifying the signal from an upstream clock, would be particularly advantageous within a telecommunications system clock such as a SONET Stratum clock. Stratum clocks provide clock pulses that are relatively free of jitter and wander for use in telecommunications system. Stratum clocks are known and described, for example, in U.S. Pat. No. 5,596,614, which is hereby incorporated by reference.

SUMMARY

A phase-locked loop (PLL) in accordance with the principles of the present invention includes an out of range detection system which monitors an input signal and detects any deviation outside a predetermined frequency range by the input signal. In response to such an excursion, the PLL provides an output signal having a stable frequency that lies within a predetermined frequency range. At the same time, the PLL monitors the input signal's frequency to determine whether the input signal's frequency reverts to an acceptable frequency within a "re-qualification" range. Should the input signal's frequency fall within the re-qualification range, the PLL proceeds to lock onto the input signal. This process of re-qualifying and locking onto an input signal as the input signal returns to an acceptable frequency range will be referred to herein as self-initializing. During the self-initialization process the new PLL may suppress further out of range detections for a predetermined period in order to prevent the PLL from thrashing about from the locked to unlocked state as an input signal gradually "settles in" to an acceptable frequency.

The new PLL is particularly suitable for application within a telecommunications system, such as a SONET telecommunications system, that employs a distributed clock for synchronous data transmission. The new PLL may be used to lock onto an upstream clock within the system to provide a stable clock output to downstream network circuits. Additionally, the new PLL may be used to monitor the frequency of the upstream clock and provide a stable output clock even if the upstream clock should fail and fall outside a prescribed frequency range. The PLL could also be used to monitor the upstream clock to determine whether the upstream clock's frequency has reverted to a frequency that falls within a re-qualifying frequency range and to lock on to the upstream clock whenever the upstream clock's frequency returns to the re-qualifying frequency range.

A clock module for use within a telecommunications system may incorporate the new self-initializing PLL. The clock module may obtain clock signals from a variety of clock sources such as a cesium clock, a GPS clock, or other highly accurate, stable clock source. With the various clock sources multiplexed to the PLL, the PLL would lock onto a preferred input clock signal and provide a stable clock output for the telecommunications system. Control circuitry could multiplex a different clock source to the PLL in response to the new PLL's detection of an out of range input signal.

BRIEF DESCRIPTION OF THE DRAWINGS

The above and further features, aspects, and advantages of the invention will be apparent to those skilled in the art from the following detailed description, taken together with the accompanying drawings in which:

FIG. 7 lists the time between transitions and corresponding frequency differences generated by comparing a variable frequency input signal to a 4 kHz reference signal.

DETAILED DESCRIPTION

In accordance with the principles of the present invention, a phase locked loop (PLL) accepts an input signal, such as a clock input signal. So long as the frequency of the clock input signal remains within a predetermined range, the PLL produces an output signal having a frequency that is proportional to the clock input signal's frequency. The PLL also includes monitor/control circuitry (control circuitry hereinafter) that monitors the clock input signal. The control circuitry detects any excursions of the clock input signal's frequency beyond a predetermined range of frequencies. If the control circuitry detects such an excursion, the PLL produces an output signal of a predetermined frequency, rather than a signal that is proportional to the input clock signal. Additionally, the control circuitry continues to monitor the input clock signal and, should the frequency return to an acceptable range, the control circuitry permits the PLL to "re-lock" on the input signal.

Figure 1:
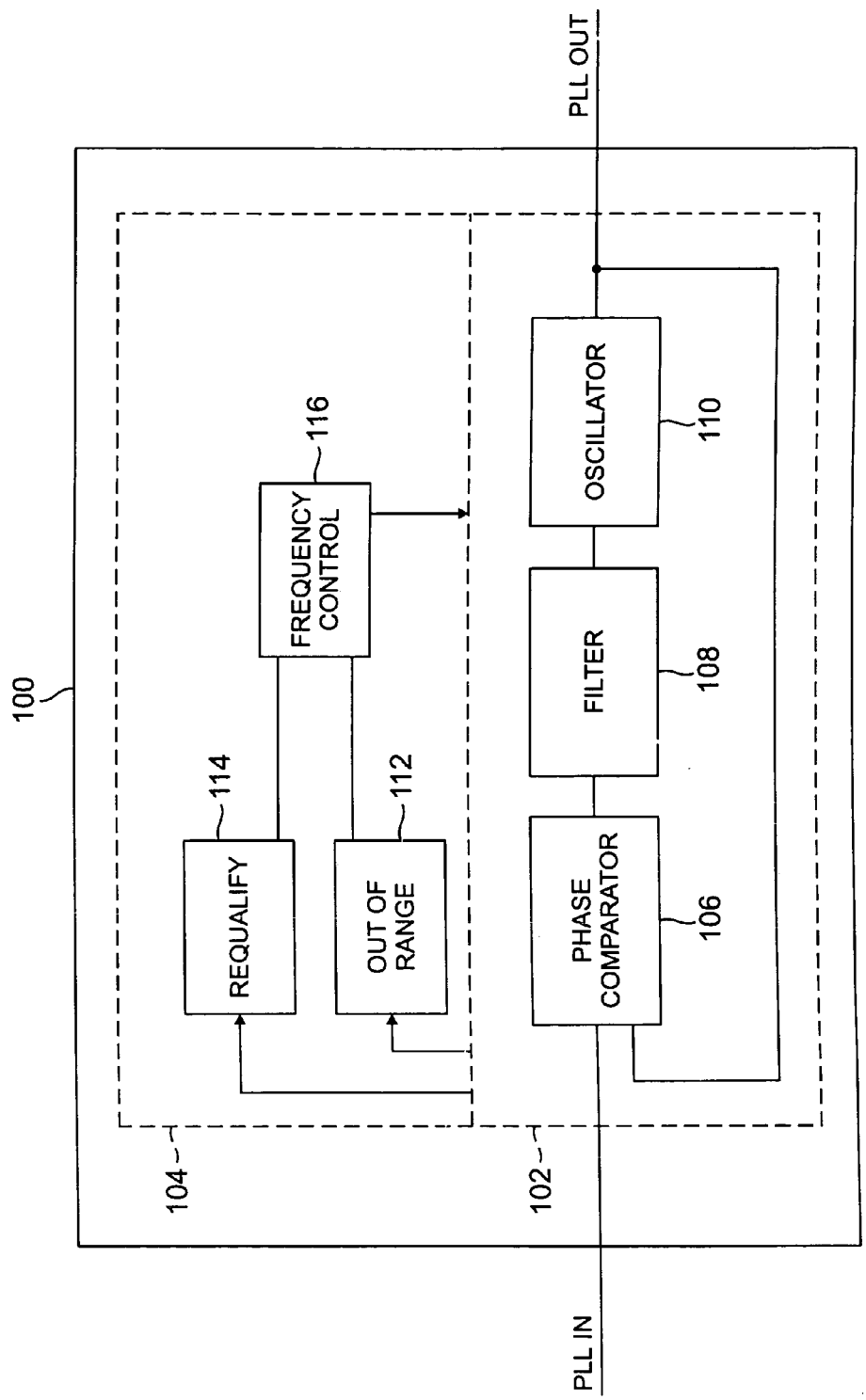
FIG. 1 is a conceptual block diagram of a phase locked loop in accordance with the principles of the invention.

The functional level block diagram of FIG. 1 illustrates the major functional components of the new self-initializing PLL. The PLL 100 includes a PLL functional section 102 and a control section 104. The PLL section 102 includes a phase comparator 106, a filter 108, and an oscillator 110. The phase comparator 106 compares an input signal PLLin to an output signal PLLout. The result of this comparison is a signal that provides a measure of the phase difference between the PLL input and output signals. If the frequencies of the PLL input and output signals, PLLin and PLLout respectively, differ, the phase comparator output will be a periodic output at the difference frequency. In this illustrative embodiment, the output of the phase comparator 106 is filtered by the low pass filter 108 to produce a signal, an analog voltage, which represents the difference between the input signal, PLLin and the output signal, PLLout.

The phase comparator 106 may be a circuit based on an Exclusive Or function (XOR), for example. Using an XOR phase comparator, the comparator's output will be a logic one whenever only one of the comparator's inputs, PLLin and PLLout, is a logic one. The period of the phase comparator's output signal provides a measure of the phase difference between the two signals. The analog voltage output of the filter 108 is used to control the oscillator 110 which may be implemented as a voltage controlled oscillator (VCO), for example. The stability of the VCO 110 may be crucial in such applications as stratum clocks within a SONET network. For such applications, a temperature compensated voltage controlled crystal oscillator would be employed in the illustrative embodiment. In operation, if the frequency of PLLout is not equal to that of PLLin, the phase-error signal from the phase comparator provides negative feedback to the VCO, thereby bringing the frequency of the output signal PLLout closer to that of the input signal PLLin and, eventually "locking onto" the input signal.

The control circuitry 104, includes a out of range detector 112, re-qualification circuitry 114, and frequency control circuitry 116. The out of range circuitry 112 monitors the PLL to determine whether the frequency of the input signals falls outside a target range. The target range may be the PLL's lock range, its capture range, or some other frequency range. Various embodiments of the out of range detector 112 are possible. In one embodiment, for example, the detector 112 monitors the control voltage that controls the VCO's output signal and therefore corresponds to the oscillator's frequency. In another embodiment the detector 112 monitors the binary values that are converted by a digital to analog converter (DAC) to produce the oscillator control voltage. In yet another embodiment, the detector 112 measures the phase drift between the PLL input and output signals.

In the illustrative embodiment, the out of range detector 112 alerts the frequency control circuit 116 whenever the input signal falls outside the target frequency range, as determined, for example, by any of the above-listed techniques. In response, the frequency control circuit 116 forces the oscillator 110 to produce an output signal at a predetermined "default" frequency within the target frequency range. In one embodiment, the frequency control circuit 116 may force the oscillator output frequency to the oscillator's mid-range value. Alternatively, the frequency control circuit 116 may force the oscillator output frequency to an oscillator value that reflects the recent history of the PLL input signal. That is, in this alternative embodiment the frequency control circuit may force the PLL output to the last frequency exhibited by the PLL that was safely within the desired frequency range prior to the PLL's loss of lock.

The re-qualification circuitry 114 may use the same techniques as the out of range circuit 112 which monitors the frequency of the input signal PLLin. That is, the re-qualification circuitry alerts the frequency control circuitry whenever the frequency of the input signal returns to the target range and, in response, the frequency control circuit 116 permits the PLL to, once again, lock onto the input signal PLLin.

Figure 2:
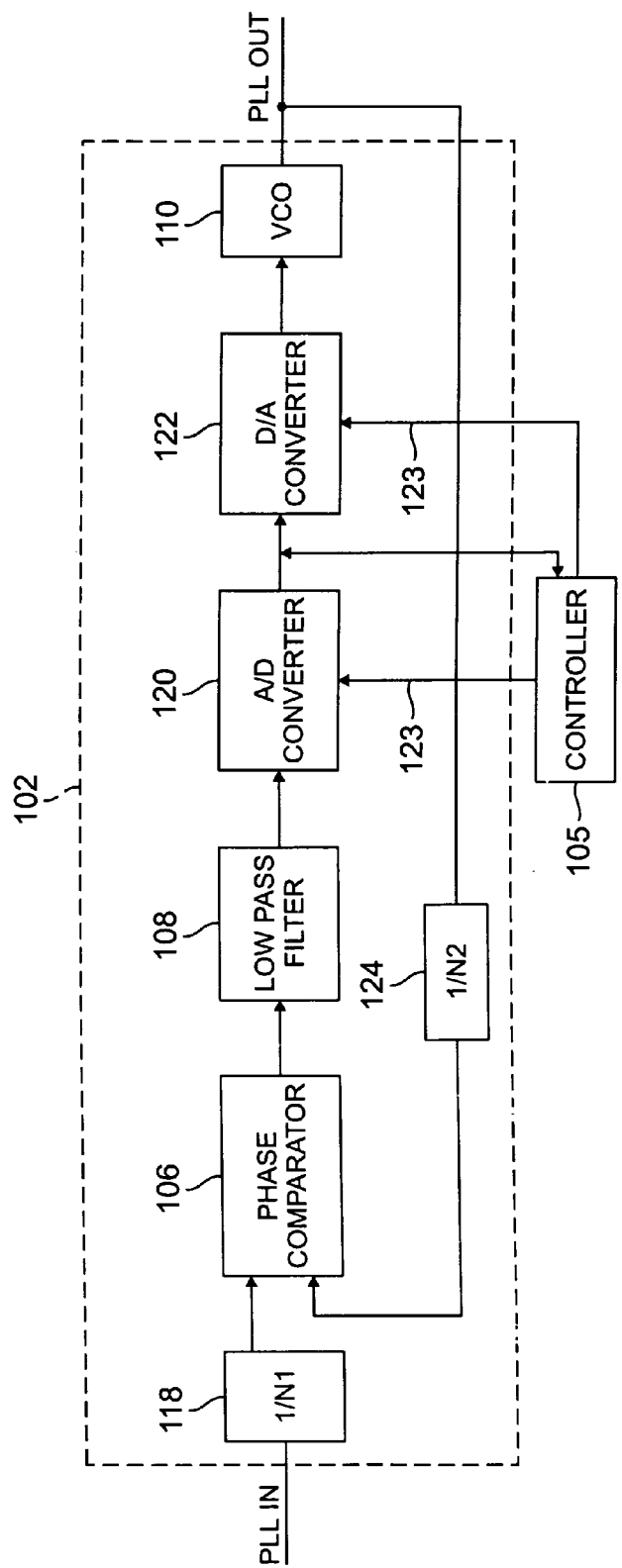
FIG. 2 is a conceptual block diagram of an illustrative digital embodiment of the new phase locked loop.

The functional level block diagram of FIG. 2 illustrates an embodiment of the invention wherein the monitor/control function is carried out by digital controller 105. The digital controller 105 could be implemented using any of a variety of known techniques and may take the form of a microprocessor, discreet control logic, application specific circuitry, or other circuitry. The PLL 102 is responsive to an input signal PLLin by dividing PLLin by N1 in a divider 118. In a typical application, the signal PLLin may be a digital clock signal, for example. The optional divider 118 reduces the frequency of the input signal PLLin by a factor of N1 in order to provide a more manageable signal. The divider output signal is routed to the phase comparator 106 which compares the divided input signal PLLin to a signal from a divider 124 divides the output signal PLLout. The phase comparator may be based on an XOR circuit and is indicative of the phase difference between the signals PLLin and PLLout. The low pass filter 108 produces a voltage output related to the frequency difference between the signals PLLout and PLLin.

In this illustrative embodiment the voltage output from the low pass filter 108 provides negative feedback to control the oscillator 110 and to thereby produce and output signal PLLout which tracks the PLL input signal PLLin. The voltage output of the low pass filter is fed to an analog to digital converter (ADC) 120 which converts the low pass filter's voltage output into a digital value. Because the output of the ADC 120 is employed to control the oscillator 110, the ADC output is related to the frequency of the PLL output signal PLLout. Therefore, the controller 105 may monitor the output of the ADC 120 to determine whether the frequency of the output signal PLLin is within its target range. The digital output of the ADC 120 is routed to the input of a digital to analog converter (DAC) 122 where the value is converted to an analog signal. The output of the DAC 122 is fed to the voltage controlled oscillator 110 which produces the PLL output signal PLLout. The frequency of PLLout is a function of the DAC output voltage. The output signal PLLout is divided down by a divider 124 for convenience and the output of the divider 124 forms the signal to which the divided input signal from the divider 118 is compared. In this way, the output signal PLLout provides negative feedback to force the DAC output voltage to a value which produces an output signal from the VCO 110 that tracks the frequency of the input signal PLLin.

In operation, the controller 105, through control lines 123, controls the rate at which the ADC 120 and the DAC 122 operate in a manner which insures that excessive delays are not introduced into the loop and stable operation is maintained. Additionally, the controller 105 monitors the digital output of the ADC 120. Whenever the controller detects a digital value that indicates that the input signal PLLin is outside a target frequency range, the controller 105 takes corrective actions. These actions may include "freezing" the output of the DAC 122 or forcing the output of the DAC 122 to another value, such as that corresponding to the mid-range frequency of the VCO 110.

If the new PLL is to be employed in a telecommunications application such as the provision of a Stratum III clock, for example, a relatively narrow lock range, slightly greater than 4.6 parts per million, may be employed with the PLL. Additionally, in order to make the effects of sampling negligible and to employ conventional analysis techniques, the DAC 122 and ADC 120 should be updated at a rate that is significantly faster than the natural frequency of the PLL. For these reasons, the ADC and DAC should preferably be updated at a rate at least twenty times the PLL's natural frequency.

Figure 3:
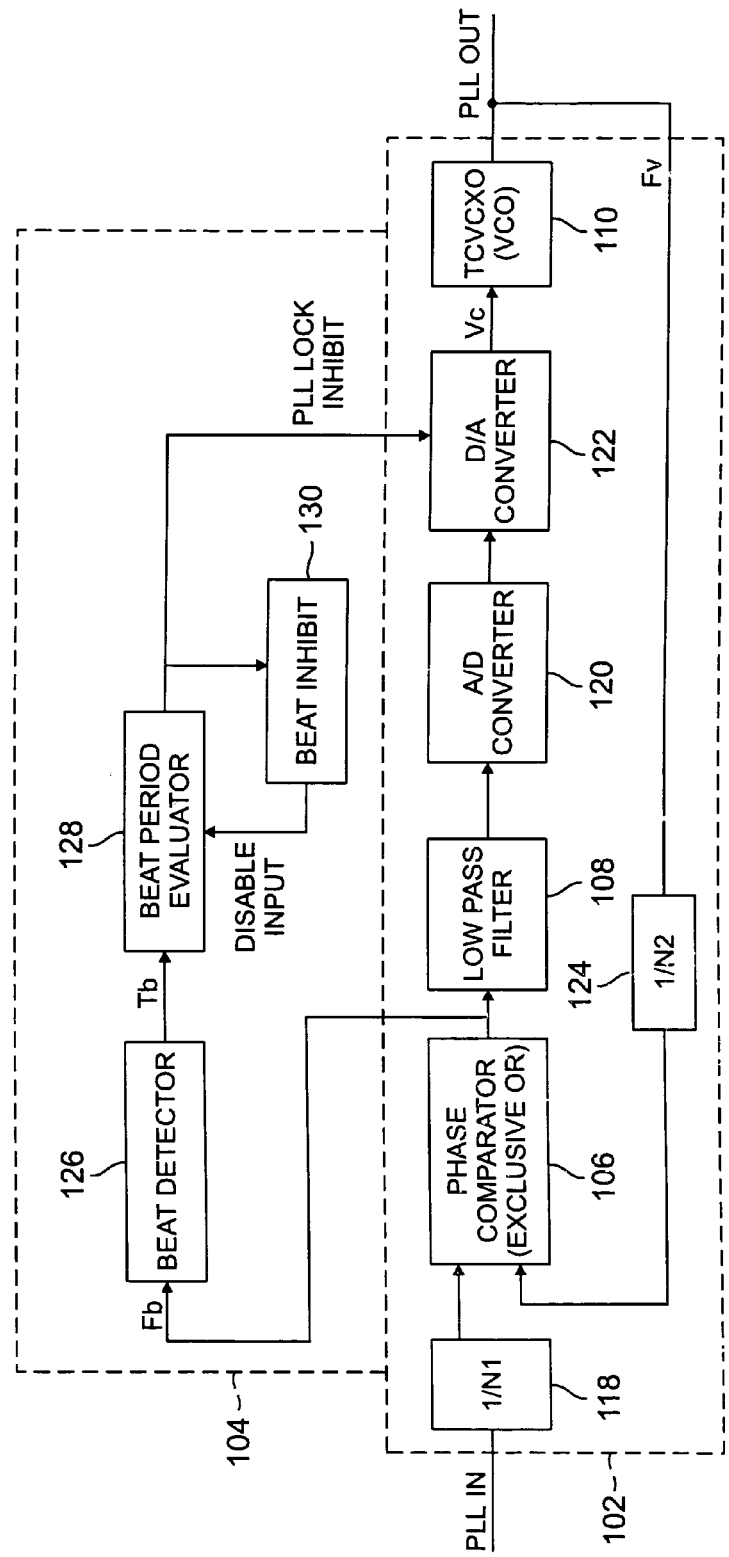
FIG. 3 is a conceptual block diagram of an illustrative embodiment of the new phase locked loop that employs a beat detector to determine whether the frequency of an input signal lies outside the phase locked loop's lock range.

Another illustrative embodiment of the self-initializing PLL is depicted in the functional level block diagram of FIG. 3. The basic PLL, including divider 118, comparator 106, low pass filter 108, ADC 120, DAC 122, oscillator 110 and divider 124 are as previously described. In this illustrative embodiment, the control circuit 104 includes a beat detector 126, a beat evaluator 128 and a beat inhibit circuit 130.

The control circuit 104 continually monitors the frequency difference between PLLin and PLLout, using an XOR # circuit. When the frequency of the PLLin, $F_I$, exceeds the lock range of the PLL, the output state of the beat detector will toggle. The transitions will occur at a frequency equal to:

$$F_b = |2((F_I/N_1) - (F_v/N_2))|$$

Where:

$F_b$=Beat frequency between VCO output and PLL input (Hz)

$F_I$=Instantaneous input frequency reference (Hz)

$F_v$=Instantaneous VCO frequency (Hz)

$N_1$=Feedforward counter $N_2$=Feedback counter

These transitions are input to the beat evaluator 128 which measures the time between transitions. Table 1, depicted in FIG. 7, lists the time between transitions and corresponding frequency differences generated by comparing a variable frequency input signal to a 4 kHz reference signal. The frequency difference is expressed in ppm off, a measure employed in telecommunications systems for which the new PLL is particularly well suited. The limits of acceptable performance for Stratum III and Stratum IV clocks are listed for reference purposes in the rightmost column.

The beat evaluator 128 may be set, for example, to acknowledge when the beat period is long enough to ensure that the frequency difference between the VCO and the frequency of the input signal PLLin is slightly greater than one half the PLL's lock range. Assuming a fairly symmetrical lock range, if $F_v$ has been driven to the end of the VCO's range and $F_I$, which was initially beyond the lock range, suddenly becomes valid, the difference between $F_v$ and $F_I$ will be approximately equal to one half of the lock range. The corresponding beat period will equal:

$$T_b = 1/0.5L_r$$

Where:

$L_r$=the PLL lock range

An input beat period with some margin for error could be chosen, for example, as:

$$T_b = 1/0.75L_r$$

Once the beat evaluator 128 decides that the instantaneous input frequency and the instantaneous VCO frequency are within an acceptable range of one another the beat evaluator 128 enables the PLL to once again acquire lock. Bellcore GR-1244-CORE (issue 1, June 1995) provides a conditional requirement for this requalification range (CR3–29). This requirement establishes a hard failure limit equal to 1.2 times the sum of twice the accuracy of the network element's clock, plus the required pull-in range. For a Stratum 3 clock, for example, the input frequency may be qualified anywhere within the range of 17 PPM to 4.6 PPM, but for the greatest accuracy, requalification should take place as close to 4.6 PPM as possible. After enabling the PLL to acquire lock, the input and VCO frequencies (PLLin and PLLout) will not be identical for the time that it takes the PLL to acquire lock. During this time, although the beat evaluator 128 will report the cycle slips that would cause the locking process to terminate, a beat inhibit circuit 130 may be employed to override signals from the beat evaluator 128 for a predetermined amount of time, thus allowing the PLL to reacquire lock. The inhibit time is set approximately equal to the beat period threshold, that is, to a time corresponding to a beat period that indicates a loss of lock.

Figure 4A:
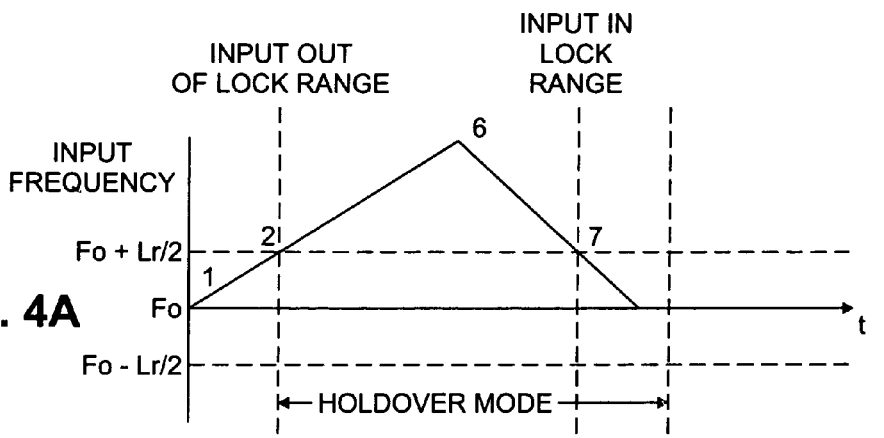
FIGS. 4A, 4B, 4C, 4D, and 4E respectively illustrate an example of an input signal whose frequency gradually increases until it lies outside the lock range of the PLL, the corresponding control voltage of the PLL's VCO, the output of the beat detector 126, the output of the beat period evaluator 128, and the output of the beat inhibit circuit.
Figure 4B:
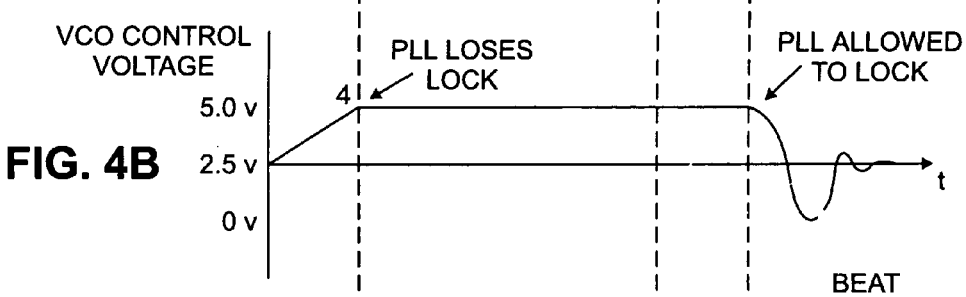
Figure 4C:
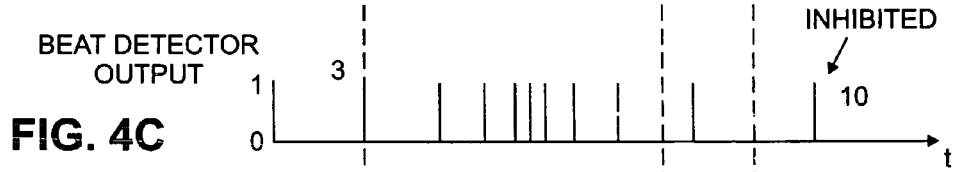
Figure 4D:
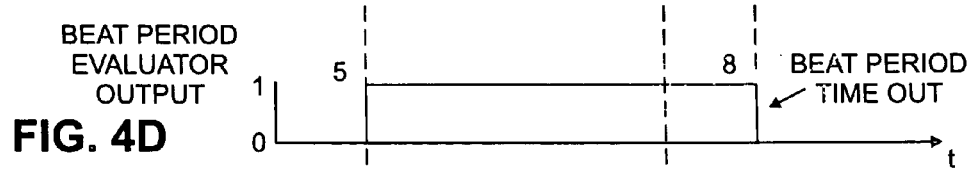
Figure 4E:

The graphs of FIGS. 4A, 4B, 4C, 4D, and 4E respectively illustrate an example of an input signal whose frequency gradually increases until it lies outside the lock range of the PLL, of the corresponding control voltage of the PLL's VCO, of the output of the beat detector 126, of the output of the beat period evaluator 128, and of the output of the beat inhibit circuit. In FIG. 4A the frequency of an input signal $F_i$ initially equals the center frequency $F_o$ of the VCO (point 1 on graph 4A) and the PLL is locked onto the input signal. As the input frequency increases, it exceeds the lock range of the PLL at point 2 of FIG. 4A and the beat detector provides an indication (point 3 on graph 4C) that the input signal's frequency is outside the PLL's lock range. This indication is used by the beat period evaluator to force the PLL output into a holdover mode. In the holdover mode a predetermined value is forced into the DAC 122. This predetermined value may be a value corresponding to the VCO control voltage at the extreme of the VCO range just traversed by the input signal (point 4 on graph 4B). The beat period evaluator 128 monitors the time between beats, searching for a period between beats that exceeds a predetermined limit, and which, therefore, indicates that the frequency of the input signal has returned to a value within the PLL's lock range (point 7 on graph 4A). After the input signal returns to within the prescribed range, the beat period will exceed the threshold (since the beat period and frequency difference are inversely proportional). Once the beat period evaluator's time constant is exceeded, it will change state (point 8 on graph 4D) and allow the PLL to begin locking to the input reference. When the output of the beat period evaluator 128 goes low the beat inhibit output becomes active (point 9 on graph 4D) and allows the PLL to re-acquire lock. Beats produced during the lock time (point 10 on graph 4C) are inhibited.

The beat frequency may be monitored by a monostable multivibrator, or one shot, that acts as an energy detector monitoring the output of the XOR phase detector 106. Under normal locked conditions, the XOR output is a square wave of 50% duty cycle at a frequency of twice the input reference. During a loss of lock condition the phase detector's output will vary between a square wave of 0% and 100% duty cycle. When the phase detector outputs either a 0% or 100% duty cycle square wave, this is indicative of the beat frequency. Transitions from 0% to 100% or 100% to 0% are indicative of half of the cycle of the beat period. Therefore, if the retriggerable monostable multivibrator's period is set for normal frequency transitions, at 1.5 times the expected output period of the XOR phase detector 106, for example, the multivibrator will be continuously reset by the XOR output as long as the XOR detector output duty cycle is between 0% and 100%. However, if the output duty cycle of the XOR phase detector 106 is 0% or 100%, there will be no transitions to reset the monostable multivibrator during the 1.5 "expected periods" of the XOR. Consequently, since it is not reset, the monostable's output will change state, thereby marking a beat event.

Another monostable multivibrator which re-triggers on pulses that occur at beat frequencies greater than one half the lock range may be used as the beat period evaluator 128. Suppose, for example, that the VCO has a minimum lock range of ±7.3 PPM and a center frequency of 4.096 MHz. The extreme beat frequency at 7.3 PPM from the center frequency is approximately 17.2 seconds (or 8.6 seconds for the half period). In this illustrative embodiment a 4 kHz signal (the input signal is divided down for convenience) is input to the XOR phase detector. The XOR phase detector yields an 8 kHz output having a variable duty cycle. When the inputs to the XOR circuit are exactly in phase, the duty cycle of the output is 0%, yielding a logic 0 output. When the inputs to the XOR circuit are out of phase by exactly 180 degrees, the duty cycle of the output is 100%, yielding a logic 1 output. The retrigger rate for the beat period evaluator monostable multivibrator is set for 8.6 seconds and will only change state for beats spaced more than 8.6 seconds apart. Therefore, when it changes state, the frequency difference between the input frequency and VCO is equal to or less than one half the lock range and the PLL may acquire lock. The beat period evaluator would, in this case, enable the digital PLL to acquire lock. In the course of acquiring lock the PLL may cycle slip causing the monostable multivibrators 126 and 128 to report beats that that would stop the locking process.

To inhibit the beat reporting during the locking a monostable multivibrator may be employed as the beat inhibit circuit 130. The multivibrator 130 produces a 3 second pulse triggered by the falling edge of the output of the beat period evaluator multivibrator 128. The three second pulse may be routed to the beat period evaluator disable input, which may take the form of a reset input, to prevent the beat period evaluator 128 from asserting a loss of lock condition during the period that the PLL is reacquiring lock. If the PLL has reacquired lock after the 3 second pulse from the beat inhibit circuit 130, the output of the phase comparator is monitored for a beat. On the other hand, if the PLL has not reacquired lock, the beat period evaluator will continue to monitor the beats and assert a loss of lock condition.

In the illustrative embodiment of FIG. 3 a 1.544 MHz input signal PLLin is fed to pre-settable feedforward and feedback counters with an XOR phase comparator 106. The 1.544 MHz signal is divided down by 386 (i.e., N2=386) to yield a signal input to the phase comparator having a frequency of 4 kHz. The output of the phase comparator 106 is routed to a low pass filter 108 which provides a feedback control voltage to be digitized by the ADC 120. The ADC 120 may comprise a VCO and 12-bit counter, both of which are strobed by a state machine at a 333 Hz rate. The ADC's VCO operates with a center frequency of 682 KHz, (333 Hz×2048 states) so that the 12 bit counter may reach 2048 states between strobes. The output of the ADC 120 is fed into a DAC 122 with latched inputs. The latched inputs are strobed at the same 333 Hz rate. However, in one embodiment, the latched inputs of the DAC 120 are strobed only if the loss of lock detector 104 indicates that the PLL is locked. In this manner, the last "good" control voltage fed to the VCO 110 will remain latched into the DAC should the PLL lose lock. Consequently, although the input signal to the PLL may have drifted outside the PLL lock range, the PLL will provide an output signal having a frequency equal to the last sampled input signal within the PLL's lock range. Alternatively, the beat period evaluator 128 or another circuit element could load the DAC with a predetermined value corresponding, for example, to the VCO's mid-range frequency which could then be strobed in to latch the value.

The PLL may falsely re-lock if $F_I$ slightly exceeds the lock range. In this illustrative embodiment, when $F_I$ exceeds the lock range of PLL, the PLL will enter holdover and a beat frequency between the VCO and $F_I$ will result. The beat period evaluator 128 monitors the period of these beats and allows the PLL to reacquire lock if the input frequency falls within one of the two following ranges:

$$F_u = (F_0 + 0.5L_r) \pm 0.75L_r$$

Or $$F_l = (F_0 - 0.5L_r) \pm 0.75L_r$$

Where:

$F_u$=upper lock frequency $F_l$=lower lock frequency $L_r$=lock range of the PLL The above ranges may vary somewhat. In particular, although the value of 0.75 Lr insures proper operation, this value is somewhat arbitrary and may be increased or decreased.

If Fi is less than Fu or Fl is greater than the highest value encompassed by Lr, the beat period evaluator will allow the PLL to reacquire lock after the initial loss of lock indication. In the act of trying to reacquire lock, the VCO frequency will be driven to its other extreme. This will once again cause a beat to be issued and cause the PLL to once again enter the holdover mode. Once in the holdover mode, the beat period will correspond to a frequency that is beyond the lock range of the PLL. Since the VCO frequency will then be beyond the acceptable upper and lower lock range boundaries, no further false locking will then occur.

Figure 5:
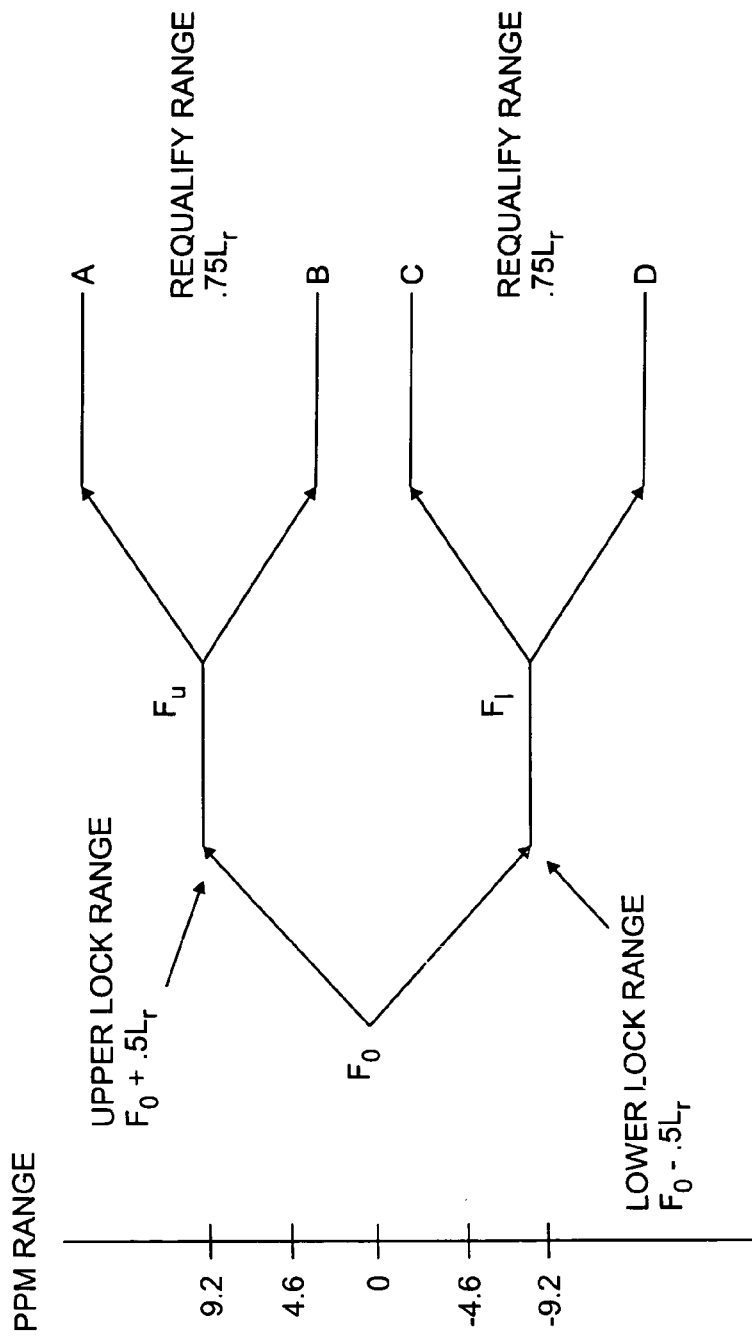
FIG. 5 is a graphical representation of the options available in selecting a requalification lock range.

The determination of upper and lower thresholds for requalification may be better understood with reference to the graphical representation of FIG. 5. The range defined by these thresholds is dependent upon the frequency reference (holdover or free-run frequency). The more accurate this frequency, the smaller the requalification range. Because this threshold is established by the oscillator, it may vary by as much as +/−4.6 PPM (in a Stratum III example) due to aging and temperature effects. The value of Lr should take this variability into account. The diagram of FIG. 5 illustrates the relationship between lock range and requalification range. A PPM range illustrates ideal operating conditions. Note the lock range and the center frequency of the oscillator are subject to change due to temperature and aging. Such effects cause non-ideal operating conditions and are not reflected by this figure. Using one recovery scheme, the PLL's frequency may be held at the last valid input frequency (holdover frequency). If the last good frequency is equal to either the upper or lower lock range, then the requalification range is dependent upon this value. If the holdover frequency is equal to the upper lock range, then the requalification range will extend from A to B. However, the PLL cannot lock to frequencies between A and $F_u$. Therefore, using this recovery scheme, frequencies in this range will cause the PLL to begin requalification in a "false lock" attempt. Similarly, frequencies at the lower end of the lock range (between $F_l$ and D) will cause the same effect.

The requalification range should, preferably, be large enough to allow all possible good input frequencies to be recognized. In the Stratum III example, frequencies need to be within the range of ±4.6 PPM. Using the "last good frequency" recovery scheme, if an input source moves outside the frequency prescribed frequency range in a particular direction, and recovers from that same direction, which is typically the case, false locking to frequencies in the range between A and $F_u$ is not an issue. However, should the input source "recover from the opposite direction", the input signal would be disrupted, resulting in a loss of signal (LOS). A LOS overrides, the frequency deviation detector and allows the PLL to lock to the newly applied input. However, so long as frequency recovery takes place over a relatively long period of time, taking tens of seconds, even minutes to recover, the "last good frequency" approach is sufficient. However, there are some frequencies where this approach will fail. For example, in the upper range, frequencies between B and −4.6 PPM are within a Stratum III range but will be rejected. Similarly, the frequencies between 4.6 PPM and C will be rejected for the lower recovery range. If the input frequency recovers in a matter of seconds, the frequency deviation detector will be unable to self-initialize. Therefore, in situations where the input frequency may recover in a matter of seconds, a false requalification avoidance approach, as discussed below, should be employed.

A requalification process in accordance with the principles of the present invention may be illustrated through the use of examples involving Stratum III clocks. In the following examples beat periods are calculated relative to an 8 kHz (125 microsecond) transition period. If there is a frequency offset of 1 ppm between PLLin and PLLout, the frequency drift between the two signals will be, equivalently, 1 microsecond/second. Each beat will therefore have a period of 125 seconds. If quicker detection is desired, the beat periods and frequencies may be recalculated to accommodate the shorter beat period.

Given that a Stratum III clock has a ±4.6 ppm operating range, and that 9.2 PPM is the PLL's upper VCO frequency limit. Should the frequency of PLLin climb to 20 ppm, the out of range circuit will force the PLL to produce an output signal that is within the Stratum III specified range. As described above, the frequency of this signal may correspond to the VCO center frequency or to any other frequency that lies within the Stratum III operating range. If the VCO center of 0 PPM is assumed, the beat generator, which may be effected by the controller 105, will generate a beat every 6.3 seconds. In order to requalify, the input signal's frequency must fall within the ±4.6 ppm Stratum III operating range and, since the beat generator will generate a beat approximately every 25 seconds at either of these extremes, a signal may be requalified if its corresponding beat period exceeds 25 seconds. Using the DAC, ADC, digital controller embodiment previously discussed, the PLL may requalify an input signal by monitoring the ADC output and requalifying the signal whenever the ADC output falls within a range corresponding to the VCO ±4.6 ppm values.

In order to avoid false requalification, the control circuit of the PLL, in addition to monitoring the frequency of the input signal PLLin to determine whether the frequency falls outside the PLL's predetermined acceptable range, forces the frequency of PLLout to a frequency which falls within the predetermined range. This frequency may correspond to the last "good" frequency value of the input signal, for example. Additionally, the PLL measures the next beat period after it's output frequency is set to a predetermined value. From the beat period, the controller determines the frequency offset $F_{b1}$ between the input signal and the predetermined output signal. The output of the PLL is then forced to a predetermined frequency within the range, such as the VCO center frequency. The PLL then measures the next beat period and calculates the corresponding frequency offset $F_{b2}$ between the input signal and this second predetermined output signal frequency. The difference between the PLL then computes the difference between the two frequency offsets, yielding a frequency margin $F_{b3}$. The offset frequency Off, that is, the difference between the minimum Stratum accuracy and the minimum lock range (e.g., 9.2 ppm–4.6 ppm=4.6 ppm for a Stratum III clock) is subtracted from $F_{b3}$ to yield the requalification beat frequency $F_{RE}$. Whenever the beat frequency is less than $F_{RE}$, the PLL is allowed to lock to the input signal and the PLL ignores any out of range detection for a period of time substantially equal to the lock time of the PLL. Once the PLL regains lock, it returns to monitoring the input signal and proceeds as previously described.

The above approach assumes that the input signal frequency is either too high or too low. Should the input signal vacillate between the two extremes, the controller could take note of the vacillation and hold the PLL at a fixed output frequency for a substantial period of time, on the order of hours, before permitting the requalification of the input signal. For example, the PLL could be forced to the fixed output mode for 24 hours if three frequency deviation events occur within a one hour time span. A manual override (not shown) permits a system operator to set the output frequency, to permit the PLL to requalify, etc.

If, for example the PLL input frequency jumps from 0 PPM (middle of the Stratum operating range) to 20 PPM, the PLL will track the input frequency until it reaches the upper VCO frequency limit (10 PPM in this example). At this point the PLL will enter a holdover mode of operation, whereby it outputs a signal having a frequency which lies within the predetermined acceptable frequency range and which is the last qualifying frequency of this type produced by PLLin. The PLL will then begin to measure the frequency offset using the beat period. At this point the beat period should be 12.5 seconds and the controller may determine the frequency offset $F_{b1}$ corresponding to 10 ppm. Next, the PLL is forced into free-run mode where the frequency stability is bound between the upper and lower Stratum frequency accuracy limits. The requalification frequency threshold will vary depending on the free-run frequency according to the description set forth above. The following table summarizes the three cases where the free-run frequency is equal to 0 ppm, 4.6 ppm and –4.6 ppm frequencies.

TABLE 2

| DESIGNATION | FREE RUN = 0 PPM | FREE RUN = 4.6 PPM | FREE RUN = –4.6 PPM |
|---|---|---|---|
| $F_{b1}$ | 10 PPM | 10 PPM | 10 PPM |
| $F_{b2}$ | 20 PPM | 15.4 PPM | 24.6 PPM |
| $F_{b3}$ | 10 PPM | 5.4 PPM | 14.6 PPM |
| $F_{off}$ | 5.4 PPM | 5.4 PPM | 5.4 PPM |
| $F_{RE}$ | 4.6 PPM | 0 PPM | 9.2 PPM |

Table 2 illustrates how the requalification frequency varies depending on the free-run frequency, where the free-run frequency is defined as the frequency to which the PLL is forced to operate by, for example, a controller. If the free-run frequency is 0 PPM, then the requalification frequency needs to be 4.6 PPM (or lower). If the free-run frequency was off by 4.6 PPM, then one would expect a requalification frequency of 0 PPM or lower. Since it is impossible to measure 0 Hz (infinite period) a default threshold, such as 60 seconds may be employed. In that case, if no beats are detected in a 60 second interval (equivalent to a 2 PPM offset frequency), then the PLL will be allowed to lock to the input reference. The actual value for the threshold could be determined by experimentation. If, however, the free-run frequency is off by –4.6 PPM, then a 9.2 PPM (or lower) requalification frequency is needed.

Figure 6:
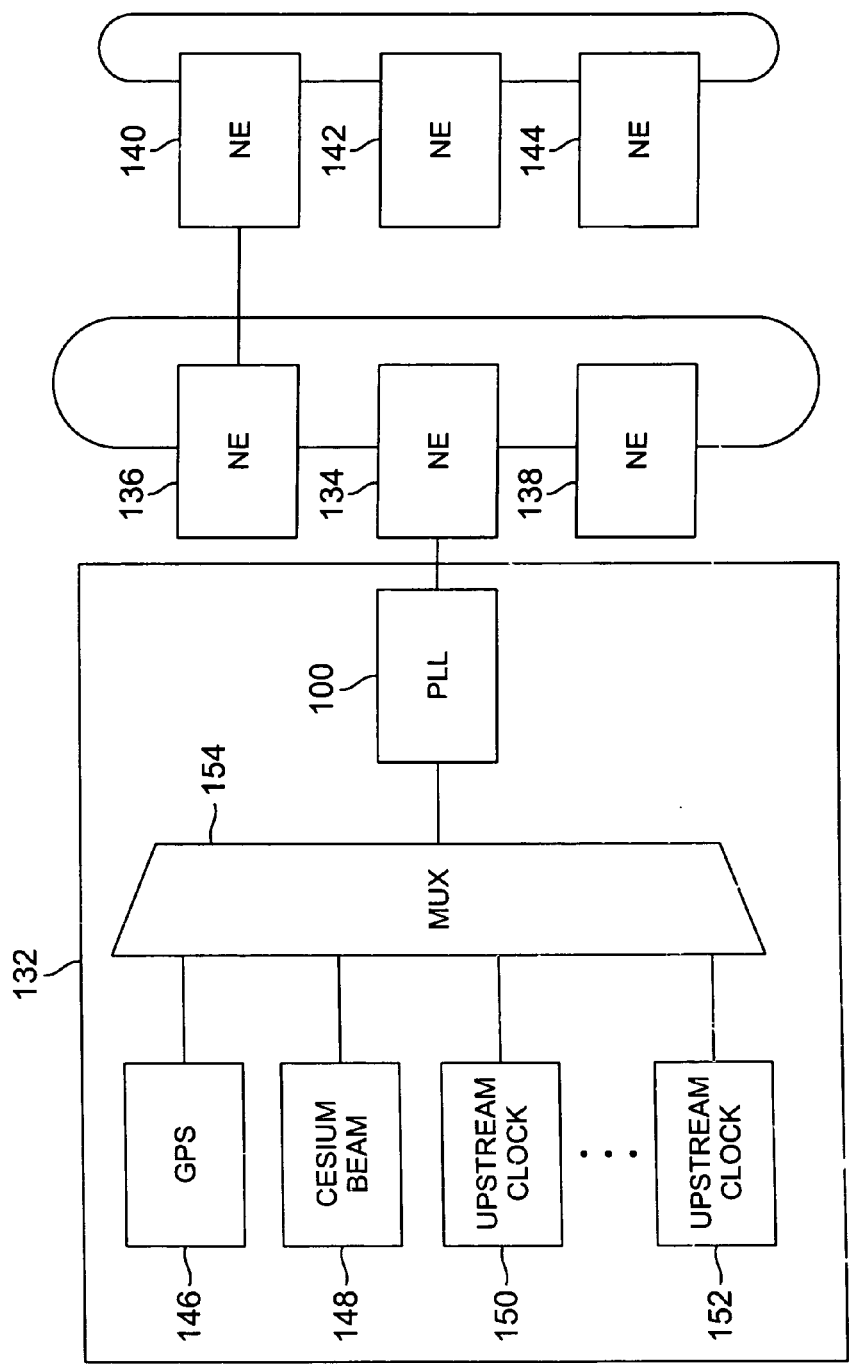
FIG. 6 is a conceptual block diagram of a clock module that employs the new phase locked loop within a telecommunications system.

The new self-initializing PLL may be employed within a clock source 132 as illustrated in FIG. 4. A PLL's VCO operates as the PLL's internal frequency standard and, in order to meet the free-running and pull in specifications of Stratum clocks, the VCO's frequency range will typically be at least twice that of the corresponding Stratum clock. Consequently, if the Stratum clock's PLL somehow fails in a manner which drives its output to one of its VCO's frequency extremes, downstream clocks may be unable to recover their timing function. In FIG. 6, the clock 132 supplies a synchronizing clock to one or more network elements such as elements 134–144 interconnected within a telecommunications network. The clock module 132 may obtain a clock input from any of a number of sources such as a GPS receiver 146, a cesium beam clock 148, an upstream clock from another element within the telecommunications network 150, or another upstream clock 152. The illustrative clock element 132 includes multiplexing circuitry 154 which selects one of the input clocks 146–152 for transmission to the PLL 100.

One of these sources may be characterized as a primary source and, should the primary source fail for any of the variety of reasons such as loss of signal, the PLL will be able to detect the failure of the primary source, as previously described. The PLL will then be able to produce an output signal within the desired target range as previously described. Additionally, once an out of target range frequency is detected, the PLL may indicate such condition to the multiplexor or may control the multiplexor in some other fashion to switch from the primary source to a secondary. For example, should the GPS source 146 fail, the PLL, after detecting the failure of the GPS source 146, may provide control signals to the multiplexor to route the signal from the cesium beam source 148 to the PLL 100.

In SONET and similar telecommunications networks a synchronization status message is employed by a network element to indicate the quality of the clock that is being used to synchronize upstream network elements. However, because the synchronization status message is not derived from a measured quantity, but from a record of the type of clock that is being used (e.g., Stratum I clock), the status message will not reflect any of the clock failures which may be addressed, by the "out of range" detection of the present invention.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A phase-locked loop (PLL) comprising:
   an oscillator responsive to a control signal by producing a PLL output signal;
   a phase comparator responsive to a PLL input signal and the PLL output signal by detecting the phase difference between the two signals and producing the control signal indicative of that difference, the control signal being coupled to the oscillator; and
   control circuitry responsive to deviations of the PLL input signal's frequency outside a predetermined input frequency range by forcing the frequency of the PLL output to a predetermined frequency, the control circuitry including beat frequency circuitry that detects deviations of the input frequency outside the predetermined input frequency range.

2. The PLL of claim 1 wherein the predetermined frequency to which the output signal is forced falls within the predetermined input frequency range.

3. The PLL of claim 2 wherein the control circuit monitors the input signal's frequency and allows the PLL to lock onto the input signal should the input signal frequency return to the range of predetermined input frequencies.

4. The PLL of claim 3 wherein the control circuit suppresses out of range frequency indications for a predetermined time period to allow the PLL to lock onto an input signal whose frequency has returned to within a predetermined range of input frequencies.

5. A phase-locked loop (PLL) comprising:
an oscillator responsive to a control signal by producing a PLL output signal,
a phase comparator responsive to a PLL input signal and the PLL output signal by detecting the phase difference between the two signals and producing the control signal indicative of that difference, the control signal being coupled to the oscillator; and
control circuitry responsive to deviations of the PLL input signal's frequency outside a predetermined input frequency range by forcing the frequency of the PLL output to a predetermined frequency, the control circuitry including measurement circuitry which determines whether the PLL input signal's frequency deviates outside the predetermined input frequency range by measuring the voltage of said control signal coupled to the oscillator.

6. The PLL of claim 5 wherein said control signal from the phase comparator is an analog signal.

7. The PLL of claim 6 wherein said control signal is coupled to said oscillator through an analog to digital converter (ADC) and digital to analog converter (DAC), and the control circuit determines frequency deviations outside the predetermined input frequency range by comparing the digital signal to digital values representative of the limits of the predetermined input frequency range.

8. The PLL of claim 5 wherein the predetermined frequency to which the output signal is forced falls within the predetermined input frequency range.

9. The PLL of claim 8 wherein the control circuit monitors the input signal's frequency and allows the PLL to lock onto the input signal should the input signal frequency return to the range of predetermined input frequencies.

10. The PLL of claim 9 wherein the control circuit suppresses out of range frequency indications for a predetermined time period to allow the PLL to lock onto an input signal whose frequency has returned to within a predetermined range of input frequencies.

11. An apparatus for providing a synchronized clock signal comprising:
a clock source that produces a clock output signal,
a PLL responsive to the clock output signal, said PlLL comprising:
an oscillator responsive to a control signal by producing a PLL output signal;
a phase comparator responsive to a PLL input signal and the PLL output signal by detecting the phase difference between the two signals and producing the control signal indicative of that difference, the control signal being coupled to the oscillator; and
control circuitry responsive to deviations of the PLL input signal's frequency outside a predetermined input frequency range by forcing the frequency of the PLL output to a predetermined frequency, the control circuitry including beat frequency circuitry that detects deviations of the input frequency outside the predetermined input frequency range.

12. The apparatus of claim 11 wherein the predetermined frequency to which the output signal is forced falls within the predetermined input frequency range.

13. The apparatus of claim 12 wherein the control circuit monitors the input signal's frequency and allows the PLL to lock onto the input signal should the input signal frequency return to the range of predetermined input frequencies.

14. The apparatus of claim 13 wherein the control circuit suppresses out of range frequency indications for a predetermined time period to allow the PLL to lock onto an input signal whose frequency has returned to within a predetermined range of input frequencies.

15. An apparatus for providing a synchronized clock signal comprising:
a clock source that produces a clock output signal;
a PLL responsive to the clock output signal, said PLL comprising:
an oscillator responsive to a control signal by producing a PLL output signal;
a phase comparator responsive to a PLL input signal and the PLL output signal by detecting the phase difference between the two signals and producing the control signal indicative of that difference, the control signal being coupled to the oscillator; and
control circuitry responsive to deviations of the PLL input signal's frequency outside a predetermined input frequency range by forcing the frequency of the PLL output to a predetermined frequency, the control circuitry including measurement circuitry which determines whether the PLL input signal's frequency deviates outside the predetermined input frequency range by measuring the voltage of said control signal coupled to the oscillator.

16. The apparatus of claim 15 wherein said control signal from the phase comparator is a analog signal.

17. The apparatus of claim 16 wherein said control signal is coupled to said oscillator through an analog to digital converter (ADC) and a digital to analog converter (DAC), and the control circuit determines frequency deviations outside the predetermined input frequency range by comparing the digital signal to digital values representative of the limits of the predetermined input frequency range.

18. The apparatus of claim 15 wherein the predetermined frequency to which the output signal is forced falls within the predetermined input frequency range.

19. The apparatus of claim 18 wherein the control circuit monitors the input signal's frequency and allows the PLL to lock onto the input signal should the input signal frequency return to the range of predetermined input frequencies.

20. The apparatus of claim 19 wherein the control circuit suppresses out of range frequency indications for a predetermined time period to allow the PLL to lock onto an input signal whose frequency has returned to within a predetermined range of frequencies.

21. The apparatus of claim 20 further comprising:
a plurality of clock signal inputs, and
a multiplexor responsive to control signals by routing a signal from one of the clock signal inputs to the input of the PLL.

22. The apparatus of claim 21 wherein the PLL control circuitry is responsive to the detection of an out of range frequency by forcing the output signal of the PLL to a predetermined frequency by routing a signal from a different one of the clock signal inputs to the PLL input.

23. A telecommunications network comprising:
a plurality of network elements at least two of which include a clock module that produces a clock output signal, and communications links connecting the network elements, the clock module of a first network element including a PLL connected to receive and to lock onto the clock output of another clock module within the network, the PLL comprising:
an oscillator responsive to a control signal by producing a PLL output signal;
a phase comparator responsive to a PLL input signal and the PLL output signal by detecting the phase difference between the two signals and producing the control signal indicative of that difference, the control signal being coupled to the oscillator; and
control circuitry responsive to deviations of the PLL input signal's frequency outside a predetermined input frequency range by forcing the frequency of the PLL output to a predetermined frequency, the control circuitry including measurement circuitry which determines whether the PLL input signal's frequency deviates outside the predetermined input frequency range by measuring the voltage of said control signal coupled to the oscillator.

24. A method of producing an output signal having a frequency that is proportional to the frequency of an input signal comprising the steps of:
(a) producing a control signal that is proportional to the phase difference between signals that are respectively proportional in frequency to the input and output signals,
(b) controlling the frequency of an output signal from an oscillator with said control signal such that the output signal from the oscillator is proportional in frequency to the input signal,
(c) detecting deviations of the input signal's frequency outside a predetermined input frequency range by measuring a beat frequency between the input and output signals, and
(d) forcing the frequency of the oscillator signal to a predetermined value when a deviation of the input signal's frequency outside a predetermined range is detected.

25. The method of claim 24 further comprising the step of:
(e) allowing the frequency of the output signal to return to a value that is proportional to the phase difference between the input and output signals if the input signal frequency returns to the range of predetermined input frequencies.

26. The method of claim 25 further comprising the step of:
(f) suppressing out of range frequency indications for a predetermined time period to allow the oscillator output signal to return to a frequency that is proportional to that of an input signal whose frequency has returned to a value within the range of predetermined input frequencies.

27. A method of producing an output signal having a frequency that is proportional to the frequency of an input signal comprising the steps of:
(a) producing a control signal that is proportional to the phase difference between signals that are respectively proportional in frequency to the input and output signals,
(b) controlling the frequency of an output signal from an oscillator with said control signal such that the output signal from the oscillator is proportional in frequency to the input signal,
(c) detecting deviations of the input signal's frequency outside a predetermined input frequency outside a predetermined input frequency range by measuring the voltage of said control signal coupled to the oscillator, and
(d) forcing the frequency of the oscillator output signal to a predetermined value when a deviation of the input signal's frequency outside a predetermined range is detected.

28. The method of claim 27 wherein step (c) comprises the steps of:
(c1) converting the control signal from and analog signal to a digital signal
(c2) comparing the digital signal to digital values representative of the limits of the predetermined input frequency range.

29. The method of claim 28 further comprising the steps of:
(e) allowing the frequency of the output signal to return to a value that is proportional to the phase difference between the input and output signals if the input signal frequency returns to the range of predetermined input frequencies.

30. The method of claim 29 further comprising the steps of:
(f) suppressing out of range frequency indications for a predetermined time period to allow the oscillator output signal to return to a frequency that is proportional to that of an input signal whose frequency has returned to a value within the range of predetermined input frequencies.

* * * * *